(12) United States Patent
Vilain

(10) Patent No.: US 8,866,082 B2
(45) Date of Patent: Oct. 21, 2014

(54) ELECTROMAGNETIC RADIATION DETECTOR WITH MICRO-ENCAPSULATION, AND DEVICE FOR DETECTING ELECTROMAGNETIC RADIATION USING SUCH DETECTORS

(75) Inventor: Michel Vilain, Saint Georges de Commiers (FR)

(73) Assignee: ULIS, Veurey Voroize (FR)

( * ) Notice: Subject to any disclaimer, the term of this patent is extended or adjusted under 35 U.S.C. 154(b) by 864 days.

(21) Appl. No.: 13/058,968

(22) PCT Filed: Oct. 6, 2009

(86) PCT No.: PCT/FR2009/051901
§ 371 (c)(1),
(2), (4) Date: Feb. 14, 2011

(87) PCT Pub. No.: WO2010/040945
PCT Pub. Date: Apr. 15, 2010

(65) Prior Publication Data
US 2011/0141286 A1    Jun. 16, 2011

(30) Foreign Application Priority Data

Oct. 7, 2008    (FR) ...................................... 08 56790

(51) Int. Cl.
| G01J 5/00 | (2006.01) |
| G01J 5/02 | (2006.01) |
| G01J 5/20 | (2006.01) |
| H01L 31/09 | (2006.01) |
| G01J 5/08 | (2006.01) |

(52) U.S. Cl.
CPC .. *G01J 5/20* (2013.01); *G01J 5/023* (2013.01); *G01J 5/02* (2013.01); *H01L 31/09* (2013.01); *G01J 5/0875* (2013.01); *G01J 5/08* (2013.01); *G01J 5/0235* (2013.01)
USPC ...................................................... 250/338.1

(58) Field of Classification Search
USPC ...................................................... 250/338.1
See application file for complete search history.

(56) References Cited

U.S. PATENT DOCUMENTS

| 5,912,464 A | 6/1999 | Vilain et al. |
| 6,410,916 B1 | 6/2002 | Jost et al. |

(Continued)

FOREIGN PATENT DOCUMENTS

| EP | 1243903 A2 | 9/2002 |
| FR | 2822541 A1 | 9/2002 |

(Continued)

OTHER PUBLICATIONS

International Search Report of PCT/FR2009/051901, date of mailing Feb. 5, 2010.

*Primary Examiner* — David Porta
*Assistant Examiner* — Djura Malevic
(74) *Attorney, Agent, or Firm* — Westerman, Hattori, Daniels & Adrian, LLP

(57) ABSTRACT

This electromagnetic radiation detector consists of a plurality of elementary detection micro-sites, each including a micro-detector provided with a membrane (2) that is sensitive to the radiation in question and each being provided in a micro-cavity or micro-capsule defined by a substrate (1), by an upper wall (5) used as a window that is transparent to said radiation and by side walls (4), said membrane (2) being suspended above substrate (1) by means of at least two support arms (6) that include an electrically conducting layer (17), with the ends of said arms (6) being anchored in side walls (4).

53 Claims, 6 Drawing Sheets

(56) References Cited

U.S. PATENT DOCUMENTS

| | | |
|---|---|---|
| 6,426,539 B1 | 7/2002 | Vilain et al. |
| 6,690,014 B1 * | 2/2004 | Gooch et al. ............... 250/338.4 |
| 7,459,686 B2 * | 12/2008 | Syllaios et al. ............ 250/338.1 |
| 7,462,831 B2 * | 12/2008 | Gooch et al. ............... 250/338.1 |
| 2002/0117623 A1 * | 8/2002 | Cole ........................... 250/338.1 |
| 2002/0175284 A1 * | 11/2002 | Vilain ........................ 250/338.1 |
| 2003/0222218 A1 * | 12/2003 | Nozu .......................... 250/338.1 |
| 2006/0157274 A1 * | 7/2006 | Stark ............................. 174/564 |
| 2008/0067389 A1 * | 3/2008 | Vilain ........................ 250/338.1 |

FOREIGN PATENT DOCUMENTS

| | | |
|---|---|---|
| WO | 95/17014 A1 | 6/1995 |
| WO | 2007/000172 A1 | 1/2007 |

* cited by examiner

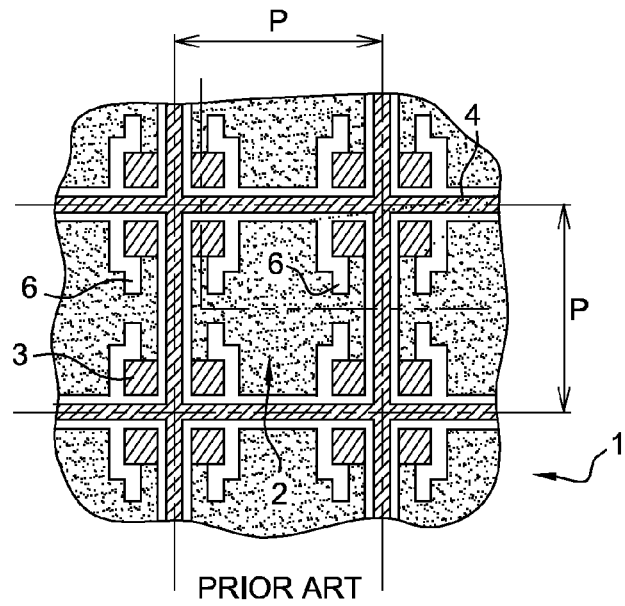
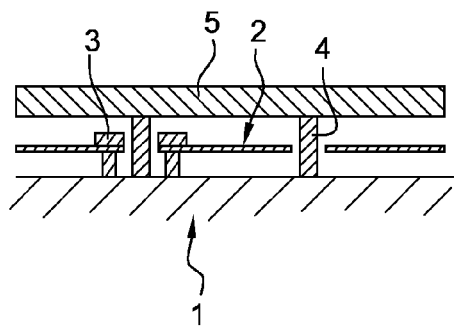
PRIOR ART
Fig. 1A
PRIOR ART
Fig. 1B
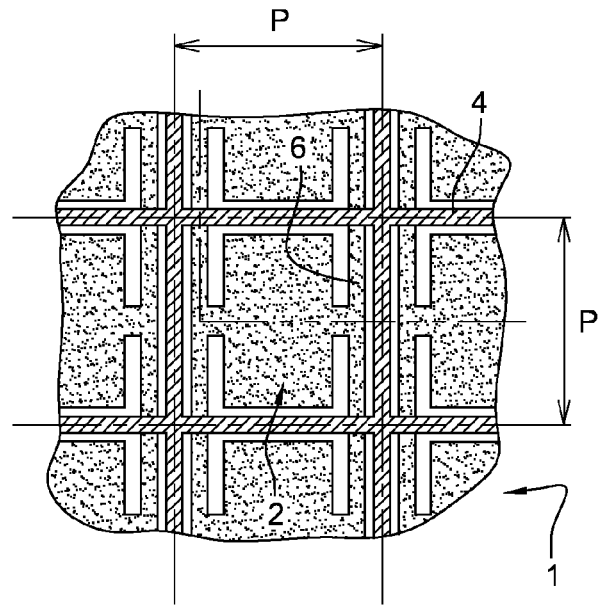
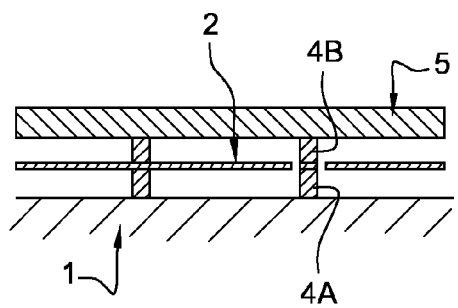
Fig. 2A
Fig. 2B

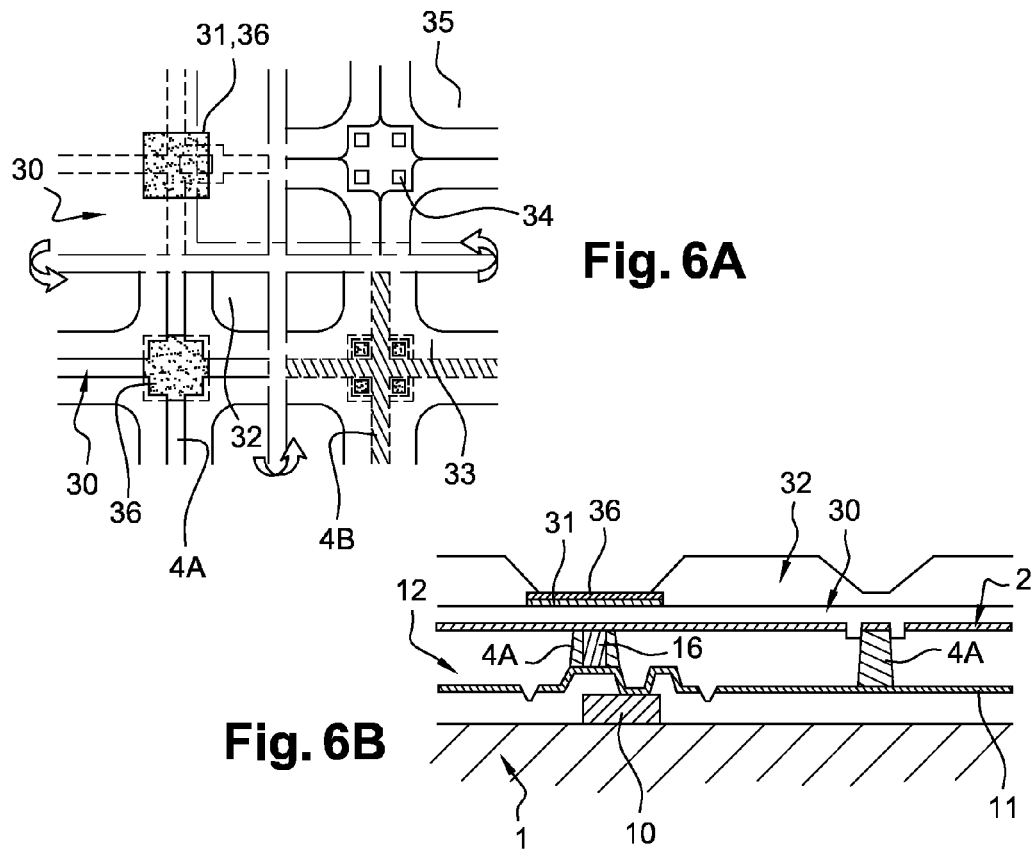
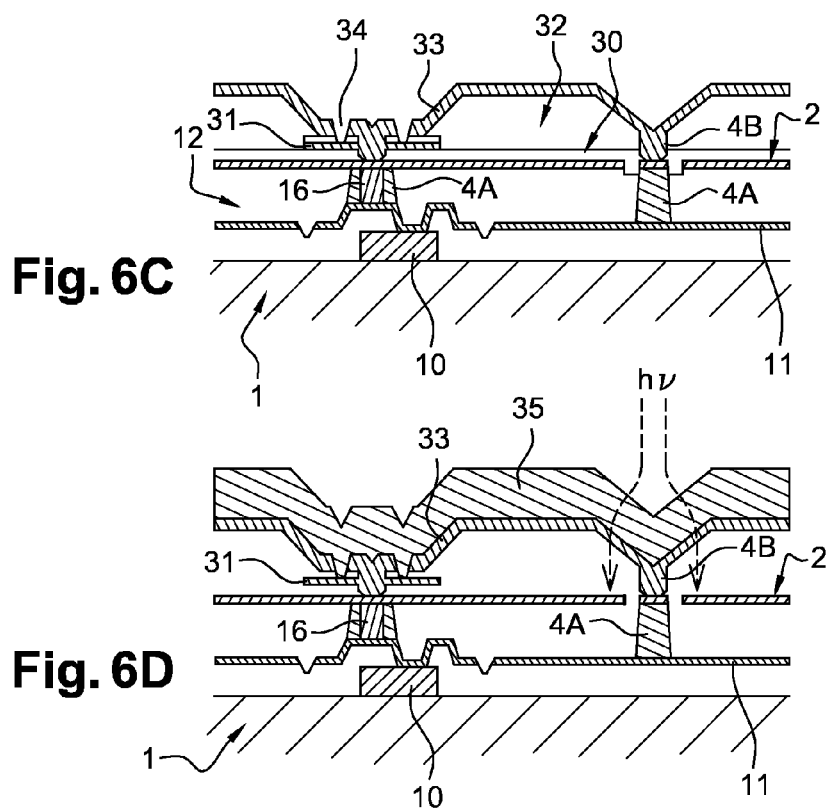

ELECTROMAGNETIC RADIATION DETECTOR WITH MICRO-ENCAPSULATION, AND DEVICE FOR DETECTING ELECTROMAGNETIC RADIATION USING SUCH DETECTORS

TECHNICAL FIELD OF THE INVENTION

The present invention relates to the field of detecting electromagnetic radiation, more precisely imaging and thermal pyrometry. More particularly, the present invention relates to a device for detecting infrared radiation comprising an array of elementary thermal detectors.

BACKGROUND OF THE INVENTION

In the field of detectors used for infrared imaging or thermography (pyrometry), it is known to use devices configured in the form of an array and capable of operating at ambient temperature which use a variation in a physical unit of a material or an assembly of appropriate materials as a function of temperature at around 300 K, i.e. without cooling. In the particular case of bolometric detectors which are the most widely used, this physical unit is electrical resistivity. Other electrical units such as dielectric constant, polarisation and even non-electrical units such as differential thermal expansion, refractive index, etc. can be exploited. These detectors are generically referred to as thermal detectors, in contrast to (photoconductive or photovoltaic) quantum detectors which only operate properly at extremely low temperatures.

Such a non-cooled detector, in its ready-to-operate state, is usually obtained by assembling the following elements:
  a substrate comprising means of matrix addressing the sensitive elements (elementary bolometers) and forming an electrical signal on the basis of each element. This substrate is commonly referred to as a Read-Out Integrated Circuit (ROIC). The surface of the substrate carries a matrix assembly of sensitive structures, each essentially formed by a membrane that is suspended by means of extremely fine, narrow arms;
  a usually highly exhausted hermetically sealed enclosure (or package) that has an illuminated face with a window that is transparent to the radiation to be detected and electrical connections designed for the external pins of the device. The "vacuum" is intended to ensure high thermal isolation between the substrate and the sensitive elements. This thermal resistance, which is fundamental in terms of ensuring that the detector is extremely sensitive, is defined by the shape of the suspension arms and the materials from which they are made.

The substrate, provided with the sensitive elements, is fitted in the cavity inside the package facing the window by bonding or brazing and the electrical connections of the substrate are separately mounted on the internal inputs/outputs of the package by wire bonding. This package also contains:
  an electrically or thermally activated getter element designed to maintain an adequate partial vacuum inside the component throughout its service life after the component has been exhausted and hermetically sealed;
  a ThermoElectric Cooler (TEC) capable of controlling the temperature of the substrate and which is inserted by bonding or brazing between the case of the package and the substrate. Use of this module is intended to eliminate the effects of temperature variations on the focal plane when the detector is in use; at present, only top-of-the-range components are equipped with such a module.

In order to obtain a scene using this detector, the scene is projected through suitable optics onto the array of elementary detectors and clocked electrical stimuli are applied via the readout circuit to each of the elementary detectors or to each row of such detectors in order to obtain an analogue and/or digital video type electrical signal that is representative of the temperature reached by each of said elementary detectors and is intended, for instance, to form a thermal image of the observed scene.

Components that are relatively simple compared with the above description are currently fabricated by assembling two parts formed by two different substrates, typically using Wafer Level Packaging (WLP) techniques. Document WO 95/17014 describes an object and a fabrication method of this type. One thus initially obtains the depressurised enclosure containing a thin-film getter, the enclosure is delimited by the two substrate components and a peripheral sealing bead. One of the substrates comprises the readout circuit and the sensitive elements, the other substrate provides the window.

The main attraction of this type of technology is the fact that a large number of hermetically sealed components can be obtained simultaneously by using a relatively limited number of parts and operations, hence saving costs. Interfacing with the external environment of the components after singulation by mechanically cutting the two substrates is, in principle, obtained in a second stage by integrating the single assembly on a base that uses, for example, Printed Circuit Board (PCB) technology and has standard metallic tracks and may also comprise electronic proximity circuitry.

The overall process of producing the depressurised enclosure, including final cutting which cannot be performed on both substrates simultaneously because the electrical input/output connections formed outside the enclosure on the substrate of the readout circuit have to be exposed, nevertheless remains relatively complex. Using two different substrates also makes it necessary to employ multiple techniques that are specific to each substrate in order to obtain the various characteristics that are necessary for their operation. For the substrate that provides the windows, for example, highly planar cavities that face each sensitive array have to be formed and localised antireflective layers have to be deposited in them. Also, both the substrates must have multilayer metallisation that is provided in order to braze the substrates together. All these techniques can be mastered but they require numerous items of expensive equipment. In addition, the technologies involved in brazing large-area substrates so that all the final components are collectively hermetically sealed have to be mastered, and this imposes particular constraints in terms of the flatness and geometrical quality of the two surfaces that are to be joined. Finally, these operations are carried out when the extremely fragile sensitive elements are exposed on the surface of the readout circuit substrate and this makes the operation especially tricky with regard to the integrity of the structures and the risk of particulate contamination.

Although they undoubtedly represent progress in terms of industrial manufacturing, these techniques nevertheless remain relatively complex and costly.

One way of partly overcoming these limitations is described in document FR 2 822 541. This document describes an object that comprises micro-cavities formed facing each detection site by using collective microelectronic technologies, thus making the fabrication process applicable in order to achieve functional depressurisation. According to the information disclosed in said document, there is no longer any need for a second substrate and this eliminates the inherent difficulties of WLP techniques, limits the number of operations and obviates the need to deploy a wide variety of technologies. What is more, vulnerability of the structures and risk of particulate contamination during fabrication, i.e. the associated reduced yields or the cost of the requisite precautions to prevent reduced yields, can be regarded as being practically zero.

However, producing micro-capsules or micro-cavities involves a loss of space over the entire footprint of each elementary detector, and this has an impact on the ultimate sensitivity of the component due to a reduction in the fill factor which (in simple terms) is related to the surface area of the sensitive membrane compared to surface area $p^2$, where p denotes the repetition pitch of the array of unitary elements (pixels) of the thermal imager. In addition, the structures that anchor the support arms of each membrane must be formed strictly inside the internal surface area delimited by the side walls that separate each micro-capsule from its neighbour. This results in a loss of sensitivity associated with limitations on the practicable length of said arms; this length defines the thermal resistance between the membrane and the substrate. However, thermal resistance is the crucial factor that determines the sensitivity of thermal detectors.

These drawbacks are not particularly detrimental if the pitch of the array is relatively widely spaced, typically down to 35 or 30 µm or even 25 µm. However, there is currently growing demand for imaging arrays with extremely high spatial resolutions having pitches down to 20 µm or even 15 µm, essentially without thereby having to accept any loss in the sensitivity of the elementary bolometer. There is therefore a need to design structures that are capable of achieving such results whilst retaining the manufacturing advantages of previous technologies.

The underlying principle of the information disclosed in the latter document is described in relation to FIGS. 1A and 1B.

FIG. 1A schematically shows a partial plan view of an array of detectors, ignoring the special features provided to allow exhaustion and hermetic sealing of the micro-sites.

The object has:
an initial substrate 1 on which the structures are collectively formed; the surface of this substrate comprises all the necessary electronic elements for the device to operate and there is no need to detail this point here
sensitive membranes 2, laid out in an array with a repetition pitch p and suspended by their support arms 6;
anchoring structures 3 on which the ends of arms 6 rest;
walls or peripheral walls 4 of the micro-capsules which separate the detection micro-sites;
top covers or windows 5 which are essentially transparent and close the micro-capsules by resting on the upper end of walls 4.

FIG. 1B supplements the description and shows a cross-section along the dotted line in FIG. 1A. There is no need to describe the construction or geometry of these elements in greater detail here but it is appropriate to specify the approximate size and geometry of the assembly.

The space between the substrate and the membranes is typically around 2 µm in order to optimise sensitivity in the usual infrared band between wavelengths of 8 to 14 µm provided a reflector (not shown) is formed on the surface of the substrate, as is well known. The space between membranes 2 and window 5 is also typically around 2 µm in order to prevent the elements being too close to each other once the cavity has been exhausted. The pitch p of such a structure is typically more than 25 µm.

It is apparent that the footprint of anchoring structures 3 (four of them are shown in FIG. 1A and this number may possibly be reduced to two if the mechanical stability of the membranes so permits) substantially limits the radiant energy that each membrane 2 can efficiently collect as a proportion of the total energy received on surface area $p^2$.

In addition, the footprint of walls 4 and the adjacent peripheral space inside the micro-capsules between walls 4 and membranes 2 also partially limit the radiant energy that can be collected by the membrane.

In other words, these geometrical considerations impose substantial limits on the fill factor, especially in case of narrower pitches.

There is another limitation in terms of the length of support arm 6 that can be realised using anchoring structures formed inside the walls compared with structures which do not have micro-capsules but do have anchoring points that are common to two (or even four) adjacent membranes. This advantageous layout, obtained by forming the anchoring points along the axis of symmetry between two (or four) sensitive sites is routine in this field when using conventional technology without micro-capsules and actually sets the level of performance of the known technology.

The aim of the invention is therefore to propose such structures and their fabrication methods in order to ultimately form detectors that benefit from enhanced performance whilst still enjoying the advantages provided by vacuum-tight micro-site technology.

Another aim of the invention is to propose specific devices, as well as their fabrication method, these devices having electro-optical characteristics that are advantageously obtained within the scope of the invention:
detectors which have micro-sites that are sensitive in several spectral bands respectively,
detectors which have locally situated reference micro-sites that are insensitive to infrared radiation,
detectors which have the ability to detect only certain polarisation orientations or directions of incidence of radiation or which have a uniform or distributed pixel high-pass filter with several cut-off wavelengths,
detectors which incorporate protection against intense radiation.

The invention is mostly detailed in the rest of this description on the basis of its architecture details which are suitable for the most common case and that which is of particular interest—detection in the Long Wave InfraRed (LWIR) region which corresponds to the 8 to 14 µm infrared atmospheric transmission window. Nevertheless, it is possible to adapt the invention's constructional details in order to exploit it in other infrared bands, even beyond the infrared region in the so-called "terahertz" domain. This is why the term "electromagnetic radiation" is sometimes used here in preference to the more limitative term "infrared".

Also, in the rest of this description, the terms "radiation of interest" or, more precisely, "spectral band of interest", the limits of which are subsequently denoted by $\lambda$min and $\lambda$max, are to be construed as the range of wavelengths for which the detector is intended (designed) to be sensitive. In the case of microbolometers, the membrane itself is usually sensitive to a very wide range of radiation frequencies (in other words it is not particularly wavelength sensitive) and, as a result, the "spectral band of interest" is in fact defined by the spectrum over which the window (in this case the window cover) is substantially transparent.

The terms "preferred spectral sensitivity" or "preferred spectrum" are also to be construed as the obtainment of maximum sensitivity (or optical response) of the detector around a particular wavelength $\lambda$p within the said spectral band of interest by means of a spectral transmission mask of the window cover that exhibits maximum sensitivity in the vicinity of that wavelength.

SUMMARY OF THE INVENTION

For this purpose, the object of the invention is a particular arrangement of the walls of hermetically sealed micro-capsules and of the anchoring points for the support arms of the membranes that constitute the elementary detectors which substantially overcomes the limitations associated with the prior art.

Thus, the invention relates to an electromagnetic radiation detector intended to operate around a preferred wavelength $\lambda p$ contained within a spectral band of interest that is defined between $\lambda min$ and $\lambda max$, consisting of a plurality of elementary detection micro-sites, each including a micro-detector provided with a membrane that is sensitive to radiation at least in the spectral band of interest and each being provided in a micro-cavity or micro-capsule defined by a substrate, by an upper wall used as a window that is transparent to said radiation in the spectral band of interest for at least some of said plurality of micro-sites and by side walls, said membrane being suspended above the substrate by means of at least two support arms that include an electrically conducting layer with there typically being a vacuum or low pressure inside each of the micro-cavities or micro-capsules.

In the text which follows, the term "hermetically sealed" is used in preference to concepts that employ terms such as "vacuum (tight)" or any specific pressure because the essential feature of the micro-capsules is their ability to maintain, throughout the entire operational service life of the finished product (several years) and taking into account the preferred presence of a getter element which is in communication with the cavity, an internal pressure that is sufficiently stable not to interfere with operation of the sensitive elements that are accommodated therein. Although attempts are generally made to achieve a pressure that is typically lower than $5 \cdot 10^{-3}$ mbar which is usually taken to be a "vacuum", a low-thermal conductivity gas (Ar, Xe, Kr) at a much higher internal pressure can meet the service life requirement and implies air-tightness in the sense stated above.

According to the invention, the ends of the support arms are anchored in the side walls.

In one embodiment of the invention, the side walls that define said micro-cavities or micro-capsules consist of two intimately joined parts:
  a first lower part that adheres to the substrate and forms semi-detached bases of the peripheral walls at each detection micro-site and locally comprises electrically conducting vertical connections that ensure electrical continuity with the electrically conducting layer of the support arms;
  a second part, the base of which is superposed on and physically attached to the top of said first part around the periphery of each micro-capsule and supports the upper wall or window which is substantially parallel to the substrate.

According to one aspect of the invention, the anchoring points and electrical connections of the ends of the arms that support the membranes are formed at the interfaces between these two parts. Because of this, the sensitivity losses inherent in detectors according to the prior art due to the limits placed on the length of the arms and the footprint of the anchoring points are substantially eliminated.

According to one advantageous aspect of the invention, peripheral facets are provided at the level of the upper walls or windows in the vicinity of the side walls so as to compensate for most of the residual reduction in the fill factor due to the footprint of said walls. More precisely, these peripheral facets which slope towards the substrate or have a rounded profile are capable of deflecting most of the incident electromagnetic radiation in the vicinity of the boundaries between two micro-sites towards one or other of the adjacent micro-cavities, essentially without any intermediate loss in terms of the signals that are available for forming an image.

Advantageously, the substrate is covered in a layer that reflects incident radiation towards the sensitive membranes, said reflector consisting wholly or partly of a material capable of collecting residual gas molecules trapped in the micro-capsules or getter consisting, for example, of titanium.

Advantageously, electrical continuity between the at least two support arms comprising an electrically conducting layer and the substrate is obtained by conduction that extends transversely relative to the axis of said arms at the level of the bond line between the two parts of the side walls as far as a vertical connection element (16) which is in electrical conduction with said substrate.

Advantageously, the detector according to the invention is devoid of any structure for anchoring the support arms of the sensitive membranes, other than the side walls that define the micro-capsules or micro-cavities.

Advantageously, hermetic sealing of the micro-cavities is obtained using materials that adhere to or are integral with the upper wall or window and rest firmly on elements that are arranged locally underneath the windows and are laterally anchored to the upper part of the side walls.

Techniques allowing removal of the sacrificial materials that are temporarily trapped inside the micro-capsules or micro-cavities and techniques for hermetically closing said micro-capsules are disclosed, for instance, in document FR 2 822 541 and, in a more practical manner, in document FR 2 864 340. Layouts that are advantageous because they are especially suitable in this context are stated in the detailed explanation of the invention.

In the context of a specific application of the invention, the micro-detectors consist of micro-bolometers and the upper wall or window of the micro-capsules is made of a material selected from the group comprising silicon, alloys of silicon and germanium and zinc sulphide, as a single layer or a multilayer.

In one particular embodiment of the invention, a first portion of the micro-sites has a preferred spectrum that is substantially different to the preferred spectrum of a second portion of the micro-sites thanks to forming at least one different layer in or on the window of one of said portions compared to the other portion.

In another particular embodiment, a first portion of the micro-sites is sensitive to the radiation of interest, whereas the second portion of the micro-sites is essentially blind, thanks to an opaque metallic layer that is deposited in or on the window of the second portion.

In one particular embodiment, at least some of the micro-sites are sensitive to the polarisation or angle of incidence of the incident radiation, thanks to a grid of conductors arranged in or on the window of said portion.

In another particular embodiment, a first portion of the micro-sites comprises a hermetically sealed micro-cavity whereas the internal cavity of a second portion of the micro-sites is in communication with the atmosphere outside the micro-capsule.

In another particular embodiment, a first portion of the micro-sites comprises a hermetically sealed micro-cavity, whereas the internal volume of a second portion of the microsites is completely filled with material.

In another particular embodiment, the detector is provided with a high-pass filter by forming at least one special layer in the window.

In one particular embodiment, a first portion of the microsites is provided with a first high-pass filter and at least a second portion is provided with a second high-pass filter. In other words, a first portion of the micro-sites is provided with a high-pass filter having a first cut-off wavelength and at least a second portion of the micro-sites is provided with a high-pass filter having at least a second cut-off wavelength.

In another final embodiment, at least some of the micro-sites comprise at least one layer formed in or on the window which lends the detector variable sensitivity, depending on the incident electromagnetic flux.

The invention also relates to a device for detecting electromagnetic radiation that uses such detectors.

BRIEF DESCRIPTION OF THE DRAWINGS

The invention will be made more readily understandable by the following description, the details of which are given merely by way of example and provided in relation to the appended drawings in which identical references relate to identical components:

FIG. 1A shows a partial schematic plan view of an array of micro-capsules according to the prior art in a generic fashion;

FIG. 1B shows a vertical cross-sectional view simplified to show only the essential elements of the object in FIG. 1A;

FIG. 2A is a partial schematic plan view of an array of micro-capsules according to the invention arranged in a simplified way in order to make the explanations clear;

FIG. 2B shows a cross-sectional view simplified to show only the essential elements of the structure in FIG. 2A along the broken line;

FIG. 6A shows a partial plan view of an array of micro-capsules according to the invention using an alternative advantageous method of forming the upper parts of the walls and covers of the micro-capsules at various stages of fabrication;

FIGS. 6B to 6D show cross-sectional views of the structure in FIG. 6A at three different stages of forming said structures;

Figure 3A:
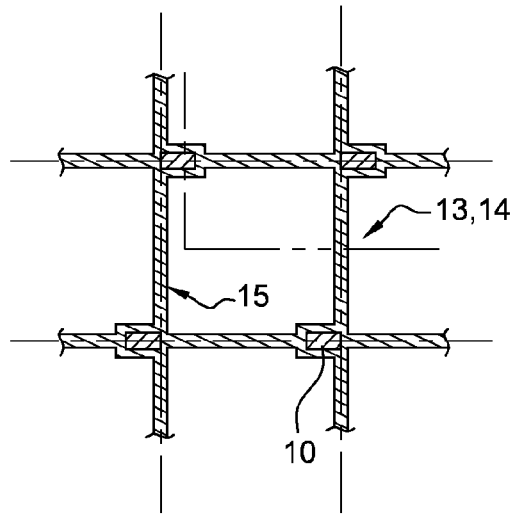
FIGS. 3A and 3C show a partial plan view of an array of micro-capsules according to the invention using a first method of forming the walls at two different stages of fabrication.

In order to make the drawings clearer in the plan views, only the limits of those stacked layers that are necessary in order to gain sufficient understanding of the relevant text are indicated for illustrative purposes. The cross-sectional views are also only as detailed as necessary, also purely for illustrative purposes, it being understood that the various materials may assume forms or have details that are different to those suggested without thereby extending beyond the scope of this invention.

It should also be noted that the term "one layer" can be construed as "one or more layers" depending whether the technology so demands at the level of a design detail, without the stated principle thereby being substantively modified or extended. This also applies to developments that are stated in order to elucidate the various particular embodiments.

DETAILED DESCRIPTION OF THE INVENTION

FIG. 2A schematically shows a design according to the invention in a form devoid of functional elements that are used for electrically wiring, exhausting and hermetically sealing the micro-sites. These elements are as follows:

initial substrate 1 on which all the structures are collectively formed;

sensitive membranes 2 of the detectors in an array with a repetition pitch p, supported by their support arms 6 which extend as far as peripheral walls 4 into which they are inserted;

walls or side walls 4 formed by superposed parts 4A and 4B;

upper covers or windows 5.

FIG. 2B supplements the description with regard to the insertion of support arms 6 of membranes 2. The anchoring structures, in their traditional form shown schematically in FIGS. 1A and 1B, have now been eliminated and arms 6 extend as far as the joint between the two parts 4A and 4B of walls 4 which act as anchoring structures formed on the axis of symmetry between sensitive sites, as is customary in the case of the known highest-performance technology. This produces a substantial gain in thermal resistance and hence improved sensitivity of the detector compared with the technology described in document FR 2 822 541. Similarly, eliminating the footprint of anchoring structures 3 shown in FIG. 1A and the associated separation spaces produces a considerable increase in the fill factor. This layout becomes almost equivalent (apart from the footprint of the walls) to conventional devices that do not have micro-capsules but are advantageously equipped with connections and anchoring points that are each shared between two, or even four, detection sites in a manner that those skilled in the art can readily comprehend.

One clear result of the structure of the detector according to the invention is that it becomes possible to build thermal detectors having an array pitch of around 25 μm, or even down to the useful physical limit for Long Wave InfraRed (LWIR) radiation of around 15 μm at the cost of negligible loss of sensitivity compared with structures produced using the known technology but devoid of micro-capsules, i.e. structures that have to be integrated using conventional techniques with all their inherent limitations, especially economic limitations, as described in the preamble. What is more, residual losses associated with the footprint of the walls can be substantially eliminated, as explained below.

Figure 3B:
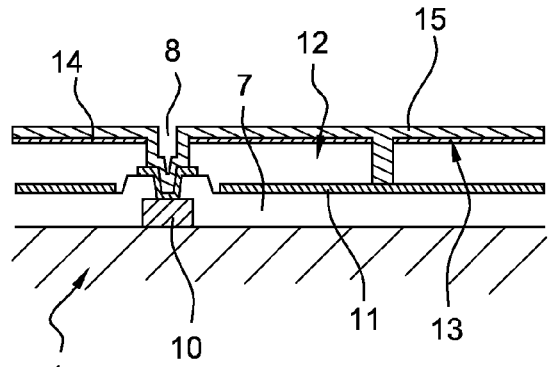
FIGS. 3B and 3D show cross-sectional views of the structure relating to FIGS. 3A and 3C respectively.

One embodiment of this detector using a first preferred, non-limitative method of forming the walls is explained below, making reference to FIGS. 2A and 3B.

The process starts by depositing and defining, by etching, a reflective metallic layer 11, for example a titanium and/or aluminium-based layer, on the surface of substrate 1. In a known manner, said substrate is passivated by a number of dielectric layers 7 that are familiar in this field. This passivation has localised openings towards metallic bump contacts 10 designed to provide electrical access to sensitive membranes 2. Reflective layer 11 is designed to form the lower part of the quarter-wave plate that is conventionally used in this field. Advantageously, and as already proposed, this layer 11 consists wholly or partly of the getter element which is generally useful when there is a requirement to maintain low pressure inside the capsules once they are finally formed.

The process continues by applying a planarising layer 12, typically an organic layer such as polyimide, having a final thickness of around 2 µm at the level of the central part of the sensitive elements.

A first layer of dielectric material 13, typically less than 0.1 µm thick, made of silicon oxide or silicon nitride, for example, is then deposited, then a layer of aluminium or amorphous silicon 14 which is roughly 0.1 to 0.2 µm thick is deposited and a grid of grooves 8 that are approximately 0.5 µm wide is formed by etching. This etching is continued by anisotropic etching of layer 12 to expose patterns 10 and the passivated surface of the substrate. In this embodiment, the width of the grooves is 0.5 µm wider, for example, in the vicinity of patterns 10. A dielectric layer or a compliant amorphous silicon layer 15 which is roughly 0.5 to 1 µm thick is then deposited in these grooves and on the surface of layer 14 by using known techniques in this industry. The thickness of layer 15 is such that the narrow parts of the grooves are completely filled and their wider parts leave an unobstructed opening of 0.5 to 1 µm.

Figure 3C:
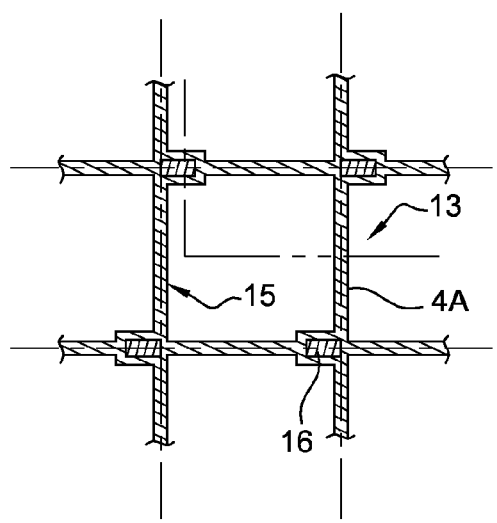
Figure 3D:
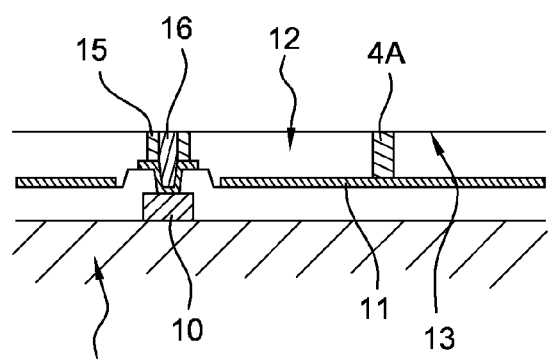

Rest of this description is based on FIGS. 3C and 3D.

Layer 15 is then anisotropically etched in order to expose layer 14 as well as the bottom of the widened parts of the grooves which opens out onto contacts 10. The narrow parts of the grooves remain filled all the way up and the vertical profile of the widened parts remains lined with layer 15. The cavities formed by the widened parts of the grooves are then metallised using techniques that are known in microelectronics and typically employ tungsten or tungsten silicide with Chemical Vapour Deposition (CVD) or electrochemical processes that involve copper, for example. This metallisation 16 fills the residual vertical cavities and covers layer 14 which is then exposed by etching metallisation 16 without a mask. Only the vertical elements of this layer 16 then remain, as apparent in FIG. 3D. Layer 14 is then also removed everywhere by etching without a mask in order to selectively expose layer 13.

Layer 14 plays an incidental role as a hard mask for etching the grooves and also acts as an etch stop layer in order to facilitate the elimination of metallisation 16 without damaging layer 13. However, if highly selective processes are used, it is possible to dispense with use of this layer 14. Those skilled in the art are aware of appropriate processes to etch layer 14, depending whether it is made of aluminium or silicon, as has been suggested.

At this stage, the lower parts 4A of walls 4 are formed, as well as the elements that allow electrical connections to the active structures of the membranes.

Figure 4A:
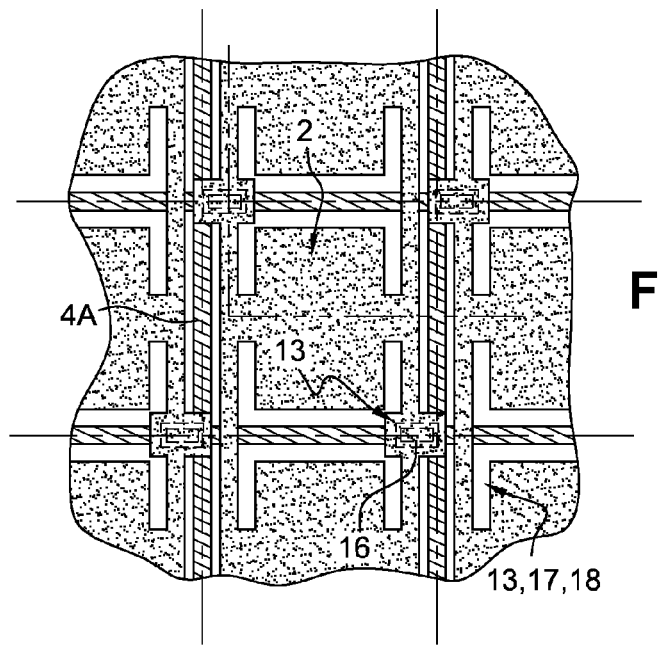
FIG. 4A shows a partial plan view of an array of micro-capsules according to the invention using a second method of forming the walls and after the step in which the membranes that constitute the detectors have been formed.
Figure 4B:
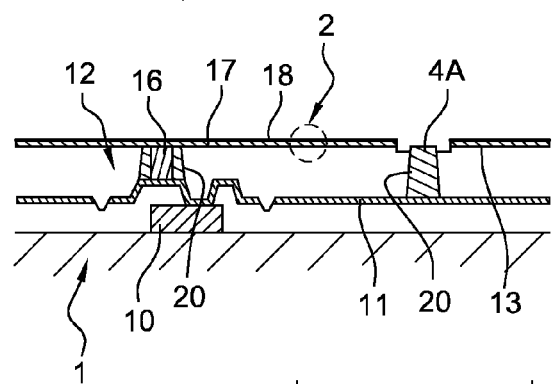
FIG. 4B is a cross-sectional view of the structure in FIG. 4A.

The method continues by forming the structures that are specific to membrane 2 and this results in the object shown in a simplified manner in FIGS. 4A and 4B.

FIG. 4B assumes complete levelling of layers 16 and 14 during the previous steps in accordance with the assembly described in relation to FIG. 3D. In this case, at this stage it is appropriate, for instance, to deposit a metallic layer 17 on layer 13, then a second dielectric layer 18 that is essentially identical to layer 13, so as to form the material for support arms 6 in a known conformation. Layer 17, made of titanium nitride for example, which is designed to ensure electrical continuity of at least two arms per membrane is formed in continuity with vertical metallisations 16 described above, as shown in plan view in FIG. 3C.

Figure 3E:
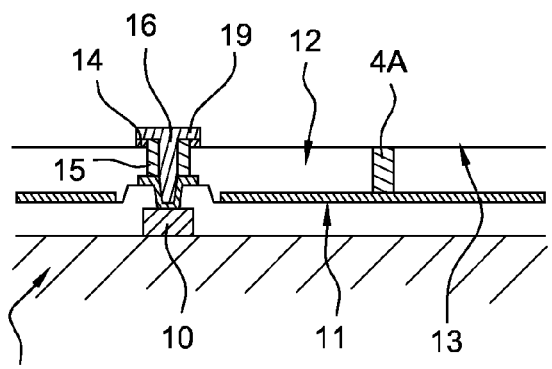
FIG. 3E shows the same cross-sectional view for an alternative method of forming the electrical connections.

Electrical continuity of the arms with contacts 10 can be achieved in accordance with the variant proposed in FIG. 3E (which does not show layer 17 for the sake of simplicity). In this particular embodiment, it is useful to insert layer 17 in sequence between layers 13 and 14. During the operations, described above, to etch layers 16 and 14 and which expose layer 17, a flange 19 is left in the immediate vicinity of vertical elements 16. Using this variant, electrical continuity is obtained in a more traditional way.

There is no need here to give a detailed description of how membranes 2 are formed or, in particular, describe the deposition and definition of one or more temperature-sensitive layers in electrical continuity with layer 17 because typical embodiments of these can be found in document FR 2 752 299 (U.S. Pat. No. 5,912,464) or FR 2 796 148 (U.S. Pat. No. 6,426,539).

It should be noted that, depending on the nature of the materials used to form the membranes, those skilled in the art will find it easy to decide whether to leave material on the tops of peripheral formations 4A or to remove it. There is no need to specify the details of the membranes in plan and cross-sectional views and the Figures below do not show the outline of the membranes in plan view in order to simplify the Figures; the outline is shown in the cross-sectional views by a thick line that is not detailed in terms of the internal structure.

It is easy to form support arms that are not intended to provide electrical continuity, i.e. support arms having a strictly mechanical purpose, if there are any, without wasting space inside the cavities, as suggested by FIG. 2A, because the layers that constitute the arms extend at least far enough to come into contact with or be located above walls 4A that are thus formed. In order to ensure, if necessary, insertion of the margins of layer 13 (or more generally, layers deposited before etching the grooves that are then reserved to constitute the insertion points of the arms) in wall 4A, it is useful, before layer 15 is deposited, to perform slight isotropic etching of sacrificial material 12 by carrying out a brief oxygen plasma treatment, for example, in order to slightly widen the groove under the edge of the mineral surface layers. Subsequently deposited filling 15 then adheres to the peripheral lower face of layer 13.

In the variant explained above with reference to FIG. 3D in which layer 17 is deposited after forming conductors 16, it is also possible to form the support points for arms designed to ensure electrical continuity at any point on walls 4A, as long as layer 17 is preserved continuously at the top of walls 4A, at least as far as one vertical connection element 16.

Figure 4C:
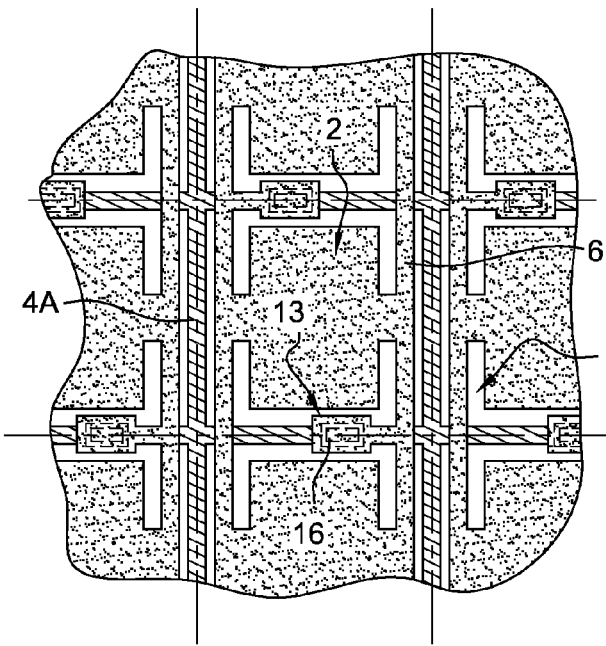
FIG. 4C shows a partial plan view of an array of micro-capsules according to the invention using a particular method of inserting the support arms for electrical purposes after the step in which the membranes that constitute the detectors have been formed.

FIG. 4C shows an example of a particular layout that exploits this possibility whereby elements 16 are formed in the grid of walls 4A in a staggered manner relative to the axis of the electrical continuity arms. In fact, anchoring the electrical support arms opposite vertical connections 16, as proposed in FIG. 4A, is only one example of a layout inspired by conventional construction according to the prior art. The reach of the electrical arms is thereby increased further because, in this case, there is no widening of the groove at the point where said arms are inserted. Thus, in FIG. 4C, layer 17, for which there is no need to represent details at the level of the arms and in the membrane, is preserved between vertical connections 16 and the point where the electrical arms are anchored in order to ensure electrical continuity from contact 10 at the level of the substrate to membrane 2.

In other words, electrical continuity between arms 6 and substrate 1 is obtained by conduction that extends transversely relative to the axis of said arms at the level of the bond line between parts 4A and 4B of the side walls as far as vertical connection element 16 which is in electrical conduction with said substrate.

This particular form of offset connector technology which extends to the top of walls 4A can also be implemented in accordance with the variant explained in relation to FIG. 3E by taking care to preserve layer 16, not only to form flange extensions 19 already described above, but also a local extension to the top of walls 4A, in accordance with the described principle, from metallised area 16 to the point where the arms providing electrical continuity are anchored.

Those skilled in the art will be able to advantageously exploit these distinctive features by maintaining or interrupting continuity of the various layers in order to ensure appropriate connectivity or isolation between the necessary connections for the membranes.

Before continuing to describe assembly, explanations regarding how the elements of lower walls 4A are fabricated in accordance with a second preferred, non-limitative embodiment are now given below in relation to FIGS. 4A and 4B, which have already been examined.

As before, this process starts by depositing and defining reflector 11 on the surface of the substrate in continuity with contacts 10. Detailed cutting of reflective pattern 11 is modified compared with those in FIGS. 3B, 3D and 3E, but this is simply another illustrative form in this example which is intended to make it easier to represent the final topographies produced by the proposed process. A roughly 2 μm thick dielectric layer 20 made of conventional materials in this field, namely silica or silicon oxide or intermediaries, is then deposited using conventional means in this field.

This layer 20 is advantageously planarised by Chemical Mechanical Polishing (CMP) and vertical openings are then made by anisotropic etching through to layer 20 in those locations where there are to be vertical electrical connections. Metallisation 16 is deposited everywhere, especially so as to fill these openings using familiar dedicated technologies, typically CVD and/or electrochemical deposition.

Layer 16 is finally leveled down to the surface of layer 20, typically using CMP which is a common technique in this field.

Figure 5A:
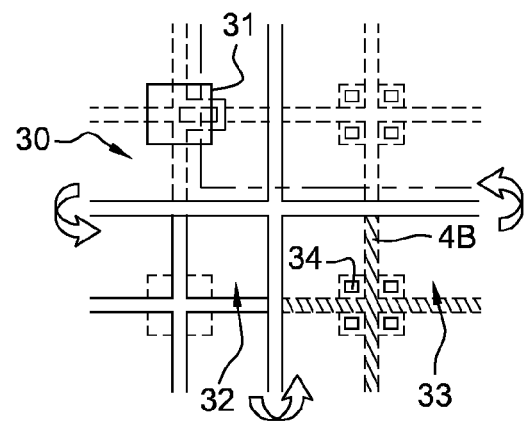
FIG. 5A shows a partial plan view of an array of micro-capsules according to the invention using a preferred method of forming the upper parts of the walls and covers of the micro-capsules and at various stages of fabrication.

Parts 4A are then defined by anisotropically etching layer 20 in accordance with the pattern exemplified in FIG. 5A as far as the surface of reflector 11 which is used as an etch stop layer. The spaces between patterns 11 appear slightly indented after this operation, as suggested by FIG. 4B, without this having any adverse affect on the desired result.

A planarising layer 12, typically a polyimide layer, is then applied in order to fill and roughly level the entire surface texture and is then planarised by etching or, preferably, by CMP in order to expose the surfaces of the tops of structures 4A. Note that it is only possible to planarise the structure using CMP once in this step if layer(s) 16 is/are left in place on the horizontal surfaces before the step in which cavities are formed in layer 20.

The process continues by depositing dielectric layer 13 which is opened very locally by etching in the vicinity of metallisation 16. Layer 17 is then deposited on the structure so as to provide electrical continuity with the top of elements 16. Having defined the arms and membranes of this layer 17 in accordance with the functional requirements, second dielectric layer 18, which is preferably similar to layer 13, is deposited and defined by etching and the process continues until the elements of the actual support arms and membranes 2 are completed, without it being necessary to detail these steps at this point.

This produces a structure according to the invention which, advantageously, in terms of complexity (number of steps) and virtually zero topography at the top of walls 4A, has the same versatile interfacing features and formed optional mechanical structures, supported by peripheral walls, as the invention.

Figure 5B:
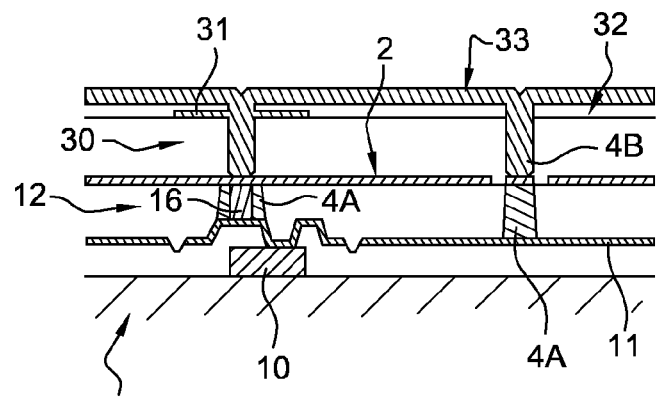
FIGS. 5B and 5C show cross-sectional views of the structure in FIG. 5A along the broken line at two different stages of forming said structures.
Figure 5C:
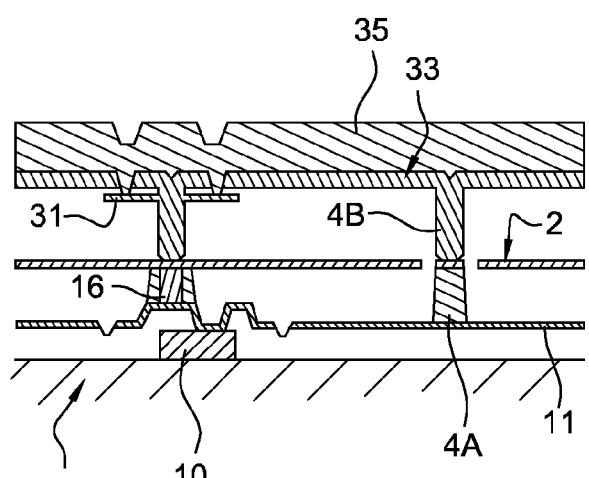

One preferred embodiment of upper parts 4B of the walls and covers (or windows) 5 is now described below in relation to FIGS. 5A, 5B and 5C.

FIG. 5A is split into four quarters which describe how construction progresses in several distinctive steps in the direction of the arrows in plan views which only depict essential elements.

The process starts by depositing planarising layer 30 which is essentially of the same type as layer 12 and is 2 μm thick, for example. A mineral layer 31 which is approximately 0.1 to 0.2 μm thick and made of silicon or silicon nitride or amorphous silicon is then deposited on the surface and defined by etching at least one compact pattern per micro-site which locally intercepts the course of walls 4A. The arrangement of patterns 31 in corners that are common to four micro-sites so as to form a polygon which is common to four micro-sites, as suggested in FIG. 5A (top left), is advantageous insofar as the resulting produced structures disrupt the quality of the finished product as little as possible. It is, however, obvious that other layouts are also viable.

A new planarising layer 32, essentially of the same type as layers 30 and 12, typically around 0.1 to 0.2 μm thick, is deposited and a cross-shaped pattern of grooves 4B is then formed by lithographing and etching layers 32, 31, 30 (bottom left in FIG. 5A) until the top of structures 4A is reached. The width and pattern of the grooves can essentially be superimposed on the geometry of pattern 4A.

A mineral layer 33 which is essentially transparent to the radiation to be detected is deposited on the assembly so as to form a filling for grooves 4B which form the upper part 4B of side walls 4 of the micro-capsules. Material 33 preferably consists of amorphous silicon, or an alloy of amorphous silicon and germanium, of suitable thickness to fill grooves 4B, i.e. typically 0.5 to 1 μm. The etching of grooves 4B may be made easier by using a relatively thin intermediate layer, for example a 0.1 to 0.3 μm thick layer, so as to form a hard mask of the same type as layer 33 but which is deposited before grooves 4B are lithographed, as is normal practice in this field.

Perforations 34 bounded within remaining patterns 31 (i.e. away from grooves 4B) are then made by etching layer 33 in accordance with FIG. 5A, bottom right.

At this point it is useful to eliminate all the sacrificial organic layers inside micro-capsules 12, 30 and 32 by using oxygen plasma for instance. Openings 34 operate as penetrating vents for oxidant species and for removing etching by-products in accordance with a known technique. Once these materials have been entirely eliminated, even from the middle of the micro-sites, the assembly is optionally pre-degassed in a vacuum for a sufficient time, for example one to several hours, at a temperature that is compatible with the materials in situ, at around typically 200 to 400° C., and the micro-capsules are hermetically sealed by depositing one or more layers 35 which are transparent to the radiation to be detected and are typically obtained by physical means and preferably by thermal sputtering. This technology is familiar to those skilled in the art. The materials used preferably have a wavelength, in the context of thermal detection, of 8 to 14 µm, such as silicon, alloys of silicon and germanium, zinc sulphide. They can be arranged in a multilayer structure which is advantageously suitable for optimising the transparency of window cover 33, 35. There is no point here in detailing the stacked layers in question which usually have a total thickness of several micrometers which is easily sufficient to hermetically seal openings 34, thereby vacuum sealing the micro-capsules in the usual case where minimal internal pressure is a requirement.

Hermetic sealing of the micro-capsules can also, as is known, be achieved by depositing a non-constituent layer of transparent windows 5 before depositing layer(s) 35. This sealing layer can be opaque and be made of a metal such as aluminium, for example, preferably obtained by sputtering. In this case, this layer must then be removed from the optical zones before depositing assembly 35, typically using a pattern identical to elements 31 by using a mask and an additional etching operation. This layer is hermetically attached to window 5 and element 31.

According to a known technique, it is also advantageous to form, inside the micro-capsules, at least one material capable of collecting residual molecules of gas trapped in the micro-capsules, molecules of titanium for example, which can be, for instance, the material or one of the materials from which reflector 11 is made. This material then works as a getter.

During this hermetic sealing step, it is also possible to provide a low-thermal conductivity gas, such as argon, krypton or xenon, at low pressure, as is known in itself. These gases do not interfere with the getter materials which continue to fulfil their role vis-à-vis atmospheric gases (oxygen, nitrogen), volatile organic residues and hydrogen which must be kept at the lowest possible levels in the micro-cavities.

The complete structure thus formed differs from structures according to the prior art in that the length of the arms that support membranes 2 is no longer limited by forming anchoring structures 3 inside the micro-sites and in that there is a substantial improvement in the fill factor of the available space left by the sensitive membranes due to the structural elimination of said anchoring structures. This results in sensitivity similar to that achieved by traditional structures that do not have micro-capsules, even in the case of thermal imagers designed with extremely small pitches which, at the same time, have the advantage of not requiring a subsequent process to hermetically integrate them in a package that has a transparent window.

An additional advantageous arrangement is now described in relation to FIGS. 6A to 6D.

Following the step to deposit layer 31, the process continues by depositing a 0.1 to 0.2 µm thick layer of aluminium 36 (or any other material having technological characteristics that make the following development possible) that is etched subsequent to layer 31 with the same pattern which has already been described. This step corresponds to the top-left part in FIG. 6A.

Sacrificial layer 32 is then deposited, it is around 1 to 2 µm thick. This layer 32 is then removed locally by etching in the vicinity of patterns 31, on the one hand, and in the vicinity of patterns 4A, on the other hand, as illustrated in FIG. 6A. The margin of layer 32 is formed so that it slopes towards the base at around 30 to 45°. This is achieved using a known technique such as a resist reflow process with a lithography mask before etching layer 32.

FIG. 6B assumes a regular profile, but a profile that is more or less rounded is also perfectly suitable. The etching of layer 32 stops firstly at the surface of layer 36 and secondly in the thickness of layers 30 and 32, without this being particularly critical. This step is shown schematically in the bottom left hand part of FIG. 6A.

The process continues by forming grooves 4B. For this purpose, layers 32 and 30 are first etched, then layers 30 (if any partial thickness thereof remains) then 36, until walls 4A are exposed at the bottom of the groove. Formation of 4B and the base of the window cover are then obtained by depositing layer 33.

Openings 34, bounded within the patterns formed by layer 36, are etched through layer 33, as indicated above; etching stops at layer 36. This point is represented in FIG. 6A (bottom right). Layer 36 is then laterally etched or even completely isotropically eliminated, typically by wet etching, so as to provide access to layer 32.

FIG. 6C precedes the next operation during which all the sacrificial layers 12, 30, 32 are eliminated through vents 34 and the free space left by layer 36. The final hermetic sealing step using physical vacuum deposition, which is described above, is schematically shown in FIGS. 6A (top right) and 6D.

The first result of this process is the formation of transparent window covers, whereof the periphery has facets that slope towards the substrate or have a rounded shape that dips towards support surfaces 4A without any major change in optical characteristics in terms of layer stacking and thicknesses which, at each micro-site, first produces an optical structure equivalent to a micro lens, i.e. a lens whose function is to deflect incident rays in the vicinity of the boundaries between micro-sites towards either of the adjacent cavities where they will ultimately be absorbed by the sensitive membranes. Without this arrangement, these rays would be absorbed or diffused on walls 4, i.e. lost in terms of forming an image. This effect is represented schematically by the dashed-line arrows in FIG. 6D. This results in additional gain in the sensitivity of individual detection sites.

Another advantageous result, in terms of processes, is that the etching process, and hence also the filling of grooves 4B, is made easier, because the residual thickness of layer 30 which is to be etched until structures 4A are exposed is substantially reduced by this effect. In fact, it is possible to jointly adjust the thickness of layers 30 and 32 relative to the depth of the desired sloping or rounded margin (facet) in order to optimise all the processes and the resulting final geometry. The depth of grooves 4B can be reduced without difficulty to 0.5 µm or even less, for example, by using an arbitrarily thin layer 30.

In addition, the thickness of layer 33 is advantageously adapted to completely fill grooves 4B, i.e. its thickness is greater than half the width of the grooves, so that the flanks of the diffraction patterns formed on layer 35 (more generally, all the layers) are abutting (do not have any part that is near vertical) so as to separate incident light beams between two adjacent micro-sites without any intermediate loss. This result can be achieved by using at least one layer obtained by CVD when forming layer 35, for example by using silicon, germanium or an intermediate alloy obtained using CVD. This arrangement also makes it possible to make hermetic sealing of the micro-cavities more secure once openings 34 have been closed.

A series of particular embodiments intended to give some or all of the micro-sites different electro-optical characteristics by at least locally modifying the nature and/or the composition of the individual window covers formed according to the invention are now described below.

In one particular embodiment, the series of layers that constitute window cover 5 of some of the micro-sites comprises a layer which is opaque over the entire infrared spectrum and extends substantially over the entire surface area of said micro-sites and is substantially continuous and metallic. Such a layer is, for instance, already used during the micro-capsule sealing operation, as stated above. In this case it is sufficient to preserve this layer at those sites that contain a micro-detector which it is necessary or advantageous to make "blind" or at least substantially insensitive to the radiation from the scene. In this case, this additional layer is part of the "window" over the micro-sites in question which is then better described by the term "cover" because it actually acts as an optical shield. If said metallic layer is not required during sealing, it can easily be additionally deposited and then etched at the optically sensitive sites before or after forming layer 35.

The advantageous result obtained is typically the ability to form, at the cost of a very slight increase in complexity, special bolometric structures that are insensitive to radiation from the scene which are referred to as reference or compensation bolometers and are usually needed in order to form a clean signal that is unaffected by common mode noise, as is well known in this field. These structures are usually arranged at the margins or around the periphery of the sensitive array surfaces and are usually very complicated to produce, other than within the scope of the invention (in the absence of micro-capsules).

In another particular embodiment of the invention, at least some of the micro-sites comprise a grid of parallel electrically conducting strips formed in or on window 5 of said micro-sites extending substantially over the entire surface area of said micro-sites and having a repetition pitch that is less than the wavelengths to be detected. The term "less than" is taken to mean no more than approximately $\lambda min/3$.

The polarisation filtering of incident radiation obtained in this way has the effect of very substantially attenuating the component of said radiation that is at right angles to the conductor grid, with the component that is parallel thereto essentially being transmitted by window 5. Those skilled in the art know how to optimise the optical absorption of a sensitive membrane located behind such a window for such polarised radiation or, on the contrary and depending on the sought-after objective, how to form a membrane that is virtually polarisation-insensitive. The details provided in Document FR 2 752 299 (U.S. Pat. No. 5,912,464), for example, are relevant in this respect.

Such a detector can, for instance, be used in order to amplify or, on the contrary, attenuate radiation from scene elements that impinge on the focal plane after reflection on a plane that is roughly parallel to the orientation of the metallic grid (reflection of hot objects on the ground for example).

Using this method to build, in a single array, micro-sites that are preferentially sensitive in one polarisation direction, on the one hand, and micro-sites that are preferentially sensitive in an orthogonal direction, on the other hand, produces a detector that provides two typically simultaneous sub-images, e.g. interlaced images, of the "horizontal" and "vertical" components of the radiation from the scene. This provides richer information concerning the observed scene.

In another particular embodiment of the invention, at least some of the micro-sites comprise a grid of electrically conducting strips formed in or on window 5 and extending substantially over the entire surface area of said micro-sites and having a repetition pitch that is of the same order of magnitude as the preferred wavelength $\lambda p$ that is to be detected. The term "order of magnitude" is taken to mean approximately $\lambda p$ to $\lambda p/2$. In other words, the repetition pitch is $\lambda p$ to $\lambda p/2$.

The term "elementary pattern" is taken to mean the smallest pattern that produces the complete diffractive grid by being regularly replicated in two directions (which are not necessarily at right angles) in a plane that is parallel to the focal plane. Said elementary diffractive pattern can be a linear, annular, cruciform or disc shaped element, these examples are given merely by way of example and are not limitative.

This way, the sensitivity of the detector is modulated depending on the angle of incidence of the radiation due to diffraction by the grid pattern. This effect can be exploited, for instance, in order to increase or, on the contrary, reduce the sensitivity of the detector, depending on the angle at which an element of the scene appears relative to the optical axis of the system in which the detector is installed.

These polarising or diffractive filters are formed in the composition of windows 5 using the same techniques as above which were developed in order to form opaque shields, given an appropriately designed mask used to define the metallic layer. The width of the conducting strips is preferably chosen so that it is substantially less than the repetition pitch. Similarly, the opaque surface area of the elementary pattern is chosen so that it is significantly less than the product of the repetition pitches in both the directions in which said elementary pattern is replicated so as not to reduce the sensitivity of the micro-detector that faces a window provided with such a grid.

In another particular embodiment of the invention, the series of layers of window 5 of a portion of the micro-sites comprises at least one layer that is transparent in the spectral band of interest and different, in terms of thickness and/or type, to the series of layers of window 5 of another portion of the micro-sites, so as to give each respective portion a different preferential spectral sensitivity.

In other words, this particular embodiment provides (at least) two categories of micro-sites located on the same electronic retina which are respectively more sensitive to (at least) two parts of the common spectral band of interest around two preferred wavelengths $\lambda p1$ and $\lambda p2$ because windows 5 formed facing each micro-detector have different transmission spectra respectively. It is not necessary for the two transmission spectra to be discontinuous and this cannot be realised using the small number of layers that constitute window 5. This aspect makes it possible, for example, to obtain, by means of the signal provided by at least two neighbouring micro-sites, information on the basis of which it is possible to discriminate the emissivity temperature of a particular object in the observed scene.

It is not possible to describe the details of this embodiment in detail because the optical transmission spectrum of multilayer systems depends very much on the thicknesses and respective indices of each layer. Nevertheless, those skilled in the art have sufficient knowledge and expertise to advantageously exploit this aspect and use one or two different layers to produce each category of sensitive site respectively. Obviously, as above, the different layer or layers must be preserved or eliminated locally, depending on the spectral response required from each micro-site by using one or more appropriate masks and associated known implementation techniques.

For instance, an increased response between 8 and 10 μm and a reduced response beyond 10 μm will be obtained for one portion of the micro-sites and vice versa for the other portion of the micro-sites. It is also possible to form so-called bispectral retinas for middle infrared (from 3 to 5 μm) and long infrared (from 8 to 14 μm) wavelengths without encountering any of the constraints with regard to the "wideband" transparency of the windows that are encountered with detectors that are integrated in a package using traditional technology where the window can only be common to all the sensitive pixels of the array because it is located far from the focal plane.

It must be appreciated that this embodiment offers the possibility of forming, in a relatively simple manner, a bispectral or even a multispectral imager whose spatial sensitivity distribution (chequerboard or interlaced lines for instance) is defined exclusively by the design of the mask or masks that determine how the various layers between the various zones (parts) of the sensitive retina are preserved or eliminated and are applied right at the end of the fabrication process.

Figure 7:
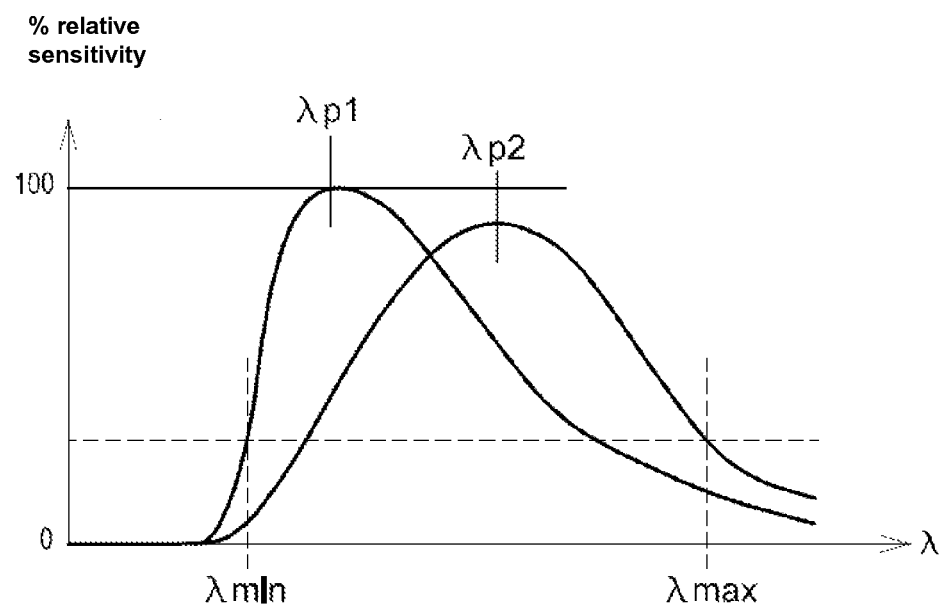
FIG. 7 is a graph showing the dual sensitivity of a detector according to the invention having two preferred wavelengths.

Such a detector with differential sensitivity around two preferred wavelengths $\lambda p1$ and $\lambda p2$ respectively is illustrated in relation to FIG. 7. In the example described, the high-pass function which is discussed below, in this case beyond $\lambda$min, is common to all the micro-sites.

In one particular embodiment of the invention, a first portion of the micro-sites comprises a hermetically sealed micro-cavity whereas the second portion of the micro-sites comprises a micro-cavity that is in communication with the external atmosphere. This aspect is obtained, for example, by masking the deposition of layer 35 on the second portion of the micro-sites or by not providing layer 31 opposite openings 34 of said micro-sites.

This produces some micro-detectors that are sensitive to the radiation for a first portion of the micro-sites and some micro-detectors that are not sensitive to the radiation for a second portion. The latter can typically be used as reference detectors in order to form a signal that is free from common-mode noise after compensation or, more generally, as detectors that are sensitive to pressure outside the device.

In one particular embodiment of the invention, a first portion of the micro-sites comprises a hermetically sealed micro-cavity whereas a second portion of the micro-sites comprises "micro-capsules" that are formed at the same time using a process that is essentially identical but are completely filled with material. This is why it is preferable to use the term "micro-capsule" rather than "micro-cavity", the latter consisting of a space delimited by solid material but itself being devoid of solid material. This aspect is immediately obtained by not providing any opening 34 in the footprint of said second micro-sites. This way, layers of sacrificial material 12, 30, 32 remain in place during the operation to remove the sacrificial layers with no functional consequences, other than forming a thermal short-circuit between the internal micro-detector and the substrate.

This way it is possible to obtain, firstly, micro-detectors that are sensitive to the radiation for a first portion of the micro-sites and, secondly, micro-detectors that are not sensitive to the radiation and are continuously kept at the temperature of the substrate (heat sunk) for a second portion, without there being any need to form an additional opaque layer.

The second micro-sites can typically be used as reference detectors in order to form a signal that is free of common-mode noise after compensation or, more generally, as detectors that are only sensitive to the temperature of the substrate and can be used, for instance, as temperature sensors.

Various ways of implementing the invention in relation to high-pass filtering of the spectral response of the detector or the device (here, this term denotes a more integrated assembly) formed by means of said detector are now described below.

It is very common practice, especially for detectors that operate in the atmospheric transparency band from 8 to 14 μm, to insert an optical element, referred to as a "high-pass" filter, upstream from the focal plane; the primary function of this filter is to block radiation having wavelengths below a threshold that is usually set at around 7.5 to 7.7 μm if the spectral band of interest is long infrared from 8 to 14 μm.

This high-pass filter is usually formed by means of a coating obtained by multilayer deposition on one of the faces or generally distributed over both faces of a thick sheet of germanium or silicon. Both faces of this sheet are also usually provided with an antireflective treatment that is typically transparent up to 12.5 to 16 μm and this is also obtained by multilayer deposition. The window sheet (or window in the usual sense of the term) is hermetically attached to and integral with the optically active face of the enclosure or traditional package of detectors according to the prior art. The overall transmission mask of this window actually defines, in the case of bolometric detectors, the "spectral band of interest" or the "radiation of interest" for the detector or device that contains said detector.

A first way of implementing the detector according to the invention under these preferred high-pass filtering conditions is to integrate it in a package provided with a traditional window such as that described above. The attraction of such assembly is firstly that the transparency mask (spectral band of interest) is defined by the window of the package. This way, transmission masks that impose onerous constraints become accessible by using a very large number of layers in accordance with well-known and fully mastered fabrication methods. In addition, the need for said package to be hermetically sealed is done away with or at least significantly relaxed and this results in considerable savings in terms of resources and fabrication yields at the level of the finished package.

Under these integration conditions, it is also advantageous to make provision to provide a medium-pressure atmosphere inside the package, for example a low-diffusivity gas such as Ar, Kr or Xe at a pressure of 10 mbar to 2 bar, so as to optimise the service life of the detector according to the invention which is fitted therein. This largely corrects the effects of any long-term permeability or even micro-cracks in windows 5 which might otherwise compromise the hermetic sealing of the micro-capsules. However, it is obvious that the cost incurred by using such a package provided with a complex window is considerable, not to mention the slight loss of performance associated with partial transparency of the additional window in the spectral band of interest.

A second way of implementing the invention and blocking short wavelengths involves forming, in or on window 5 of at least some of the micro-sites, at least one layer that directly gives said window 5 a "high-pass" filter capability in terms of spectral transmission.

This special layer can be deposited advantageously at the end of the process on the surface of the window so as to allow the use of materials that are effective but incapable of withstanding even limited temperatures, for instance temperatures in excess of 150° C., because the detector fabrication process has been finished by this time.

Advantageously, this layer is formed by a semiconductor material having an optical band gap that is appropriate to the range of radiation for which the detector is designed. Wavelengths that correspond to energies in excess of said optical band gap will be very effectively blocked by the effect of direct photo electronic transitions in the material. For example, "III-V" binary compound InSb produces cut-off at around 7.3 μm and "III-V" binary compound InAs produces cut-off at around 4 μm. "III-V" ternary alloys such $In_{(1-x)}$ Al$_x$Sb or In$_{(1-x)}$Al$_x$As in which 0≤x≤1, provide cut-off adjustment between medium infrared and long infrared, depending on the chosen composition of x. Similarly, choosing composition x of a material such as "II-VI" ternary Hg$_{(1-y)}$Cd$_y$Te in which 0.2≤y≤0.6, makes it possible to adjust the transparency threshold from the visible band down to typically 8 μm, window 5 being essentially opaque below said threshold. Choosing x of approximately 0.4 produces cut-off in the vicinity of 3 μm and choosing x of approximately 0.2 produces an adjustable cut-off threshold at about 7-8 μm, which is suitable for detection in accordance with the invention at long infrared wavelengths. One should also mention lead sulphide PbS which produces cut-off at around 3 μm. These examples are given for information only and are not limitative.

It is necessary to obtain a high degree of purity or crystallinity in order to obtain the desired effect. Conventional methods of depositing thin films of these materials, e.g. those used in order to obtain thicknesses of 0.5 to 2 μm, are suitable for the desired purpose and there is no need to describe them here.

At wavelengths below 1.8 μm, there is no need to filter the radiation spectrum in as much as infrared detection systems or imaging systems routinely have germanium optics which are opaque to low wavelengths. High-pass (wavelength) filtering of the incident radiation spectrum is thus obtained directly without any need to insert an additional window upstream of the detector on the system's optical path.

The invention also proposes forming a first high-pass filter with a first transmission threshold on a first portion of the micro-sites and a second (or more) high-pass filter with a second transmission threshold on a second (or more) portion of the micro-sites. This result is achieved by selecting the material from which the "high-pass" layer used at each micro-site respectively is made, e.g. choosing a different material from among the materials stated above, or superposing a layer of a first high-pass material on one portion of the micro-sites and two layers of different high-pass materials respectively on another portion of the micro-sites. This achieves distributed spectral sensitivity of the micro-detector, depending on the micro-site in question, through incident radiation cut-off filtering in combination with, or as an alternative to, forming the distributed antireflective coating described above (intended to provide preferential sensitivity around wavelengths λp1 and λp2).

In other words, in this particular embodiment, the spectral band of interest of the detector is defined, on the short wavelength side, by the lowest cut-off frequency and the portion of the spectrum between the two cut-off frequencies can only be sensed by some of the micro-sites.

In yet another embodiment, at least some of the micro-sites comprise a window 5 whereof at least one layer has variable transparency, depending on the incident electromagnetic flux. More precisely, a particular layer whose transparency drops rapidly beyond a radiant power threshold that is characteristic of the material can be used.

Such a layer can be obtained, for example, using materials that are referred to as "non-linear" in industry parlance, such as InSb, In$_{(1-x)}$Al$_x$Sb, In$_{(1-x)}$Al$_x$As in which 0≤x≤1; Hg$_{(1-y)}$Cd$_y$Te in which 0.2≤y≤0.6 and vanadium oxides (usually designated by the generic formula VOx in this field) and used in the form of thin films having a thickness of 0.5 to 2 μm in accordance with standard industry techniques.

This provides at least partial but very advantageously individual (pixel-based) protection of the sensitive bolometric elements located inside the micro-capsule in cases where intense radiant flux, typically from a source in a scene having an extremely high temperature, is projected on the focal plane of the detector (by accidentally observing the sun for example). Such a source is, in fact, likely to cause lasting or even permanent damage to the characteristics of the micro-detector(s) in question.

Because this special "protective" layer is located practically on the focal plane, incident energy is also virtually concentrated only at the level of the actual detector and this maximises efficiency relative to the flux received by the detector. It must be appreciated that the functionality of the device, in terms of continuous availability of an image for the user, is preserved even during any periods of intense irradiation. The conventional techniques used in this field result in one notable fault that affects the user: image loss, either locally due to saturation of the signal obtained from overexposed pixels or complete image loss due to automatic closing of the shutter after a scene that is deemed to be too intensely emissive is detected if the system is equipped with such an automatic feature.

The invention claimed is:

1. An electromagnetic radiation detector intended to operate around a wavelength λp contained within a spectral band of interest that is defined between λmin and λmax, comprising a plurality of micro-sites, each of the micro-sites including a membrane that is sensitive to radiation at least in the spectral band of interest and each of the micro-sites being provided in a micro-cavity or micro-capsule defined by a substrate, by an upper wall used as a window that is transparent to said radiation in the spectral band of interest for at least some of said plurality of micro-sites and by side walls attached to the substrate and the upper wall, said membrane being suspended above the substrate by means of at least two support arms that include an electrically conducting layer, each of said support arms comprising an end mechanically attached to the substrate, wherein the ends of said support arms attached to the substrate are anchored in said side walls, and wherein the substrate and the side walls are made of successive layers that are formed directly upon each other by deposition.

2. The electromagnetic radiation detector as claimed in claim 1, wherein at least some of the micro-cavities are hermetically sealed.

3. The electromagnetic radiation detector as claimed in claim 2, wherein the hermetically sealed micro-cavities contain a low-thermal conductivity gas.

4. The electromagnetic radiation detector as claimed in claim 1, wherein it is devoid of any structure for anchoring the support arms of the sensitive membranes other than the side walls that define the micro-capsules.

5. The electromagnetic radiation detector as claimed in claim 1, wherein the upper wall has in the vicinity of the side walls, peripheral facets that slope towards the substrate or a rounded profile capable of deflecting incident radiation in the vicinity of the boundaries between two micro-sites towards either of the adjacent micro-cavities.

6. The electromagnetic radiation detector as claimed in claim 1, wherein the substrate is covered with a layer that acts as a reflector to reflect incident radiation towards the sensitive membranes.

7. The electromagnetic radiation detector as claimed in claim 6, wherein the reflector consists wholly or partly of a material capable of collecting residual gas molecules trapped in the micro-cavities or getter.

8. The electromagnetic radiation detector intended to operate around a wavelength λp contained within a spectral band of interest that is defined between λmin and λmax, comprising a plurality of micro-sites, each of the micro-sites including a membrane that is sensitive to radiation at least in the spectral band of interest and each of the micro-sites being provided in a micro-cavity or micro-capsule defined by a substrate, and by an upper wall used as a window that is transparent to said radiation in the spectral band of interest for at least some of said plurality of micro-sites and by side walls attached to the substrate and the upper wall, said membrane being suspended above substrate by means of at least two support arms that include an electrically conducting layer, each of said support arms comprising an end mechanically attached to the substrate, wherein the ends of said support arms attached to the substrate are anchored in said side walls, and wherein the side walls that define said micro-cavities or micro-capsules consist of two intimately joined parts:

a first lower part that adheres to the substrate and forms semi-detached bases of the peripheral walls at each detection micro-site and locally comprises electrically conducting vertical connections that ensure electrical continuity with the electrically conducting layer of the support arms;

a second part, the base of which is superposed on and physically attached to the top of said first lower part around the periphery of each micro-capsule and supports the upper wall which is substantially parallel to the substrate.

9. The electromagnetic radiation detector as claimed in claim 1, wherein the micro-capsules of some of the micro-sites are filled with solid material.

10. The electromagnetic radiation detector as claimed in claim 1, wherein the substrate, the side walls and the upper wall are made of successive layers that are formed directly upon each other by deposition.

11. The electromagnetic radiation detector as claimed in claim 1, wherein the micro-detectors consist of microbolometers and the upper wall is at least partly made of a material selected from the group consisting of silicon, alloys of silicon and germanium, and zinc sulphide, as a single layer or a multilayer.

12. The electromagnetic radiation detector as claimed in claim 11, wherein the upper wall of a first portion of the micro-sites comprises at least one layer that is essentially transparent in the spectral band of interest which is different compared to the upper wall of at least a second portion of the micro-sites so that the wavelength $\lambda p1$ of the micro-detectors of the first portion is substantially different to the wavelength $\lambda p2$ of the at least second portion.

13. The electromagnetic radiation detector as claimed in claim 11, wherein the upper wall of some of the micro-sites comprises a layer that is substantially continuous and extends substantially over the entire surface area of said micro-sites and is opaque to all the radiation in the infrared spectrum.

14. The electromagnetic radiation detector as claimed in claim 13, wherein the opaque layer is made of metal.

15. The electromagnetic radiation detector as claimed in claim 11, wherein the upper wall of at least some of the micro-sites comprises a grid of electrically conducting patterns that substantially cover the entire surface area of said micro-sites.

16. The electromagnetic radiation detector as claimed in claim 15, wherein said grid is formed by parallel strips or lines arranged with a repetition pitch that is less than $\lambda min/3$.

17. The electromagnetic radiation detector as claimed in claim 16, wherein the upper wall of a first portion of the micro-sites comprises a grid formed in a first direction and the upper wall of a second portion of the micro-sites comprises a grid formed in a direction that is at right angles to the direction of the first grid.

18. The electromagnetic radiation detector as claimed in claim 15, wherein said grid is formed by repeating, in two directions in a plane parallel to the focal plane and with a repetition pitch of $\lambda p$ to $\lambda p/2$, an elementary pattern having dimensions that are equal to or less than the repetition pitch.

19. The electromagnetic radiation detector as claimed in claim 11, wherein at least some of the micro-sites comprise a window whereof at least one layer consists of a material having a high-pass type transmission spectrum.

20. The electromagnetic radiation detector as claimed in claim 19, wherein the material is a semiconductor.

21. The electromagnetic radiation detector as claimed in claim 20, wherein the semiconductor is selected from the group consisting of $In_{(1-x)}Al_xAs$, $In_{(1-x)}Al_xSb$ in which $0 \leq x \leq 1$; $Hg_{(1-y)}Cd_yTe$ in which $0.2 \leq y \leq 0.6$; and PbS.

22. The electromagnetic radiation detector as claimed in claim 19, wherein a first portion of the micro-sites is provided with a high-pass filter having a first cut-off wavelength and at least a second portion of the micro-sites is provided with a high-pass filter having at least a second cut-off wavelength.

23. The electromagnetic radiation detector as claimed in claim 11, wherein at least some of the micro-sites comprise an upper wall whereof at least one layer consists of a material having variable transparency as a function of the incident electromagnetic flux.

24. The electromagnetic radiation detector as claimed in claim 23, wherein said material is selected from the group consisting of $In_{(1-x)}Al_xSb$, $In_{(1-x)}Al_xAs$ in which $0 \leq x \leq 1$; $Hg_{(1-y)}Cd_yTe$ in which $0.2 \leq y \leq 0.6$, and vanadium oxides having the generic formula VOx.

25. A device for detecting electromagnetic radiation designed to operate around a wavelength $\lambda p$ contained in a spectral band of interest defined between $\lambda min$ and $\lambda max$, comprising:

a hermetically sealed package provided with an upper wall on one of its faces, said upper wall being substantially transparent in the spectral band of interest and substantially opaque below a cut-off wavelength;

an electromagnetic radiation detector located inside a package facing said upper wall;

wherein the detector is as claimed in claim 11 and the atmosphere inside the package consists of a low-diffusivity gas or a mixture of low-diffusivity gases.

26. The device for detecting electromagnetic radiation as claimed in claim 25, wherein the gas is selected from the group comprising argon, krypton and xenon.

27. The device for detecting electromagnetic radiation as claimed in claim 25, wherein the pressure inside the package is 10 mbar to 2 bar.

28. The electromagnetic radiation detector as claimed in claim 8, wherein the hermetic sealing of the micro-cavities is formed by materials that adhere to or are integral with the upper wall and rest firmly on elements that are arranged locally underneath the upper wall and are laterally anchored to the upper part of the side walls.

29. The electromagnetic radiation detector as claimed in claim 8, wherein the anchoring points and electrical connections for the ends of the at least two support arms comprising an electrically conducting layer of sensitive membranes are formed at the interfaces between the two parts that constitute the side walls.

30. The electromagnetic radiation detector as claimed in claim 8, wherein electrical continuity between the at least two arms and the substrate is obtained by conduction extending transversely relative to the axis of said arms at the level of the bond plane between the first part and the second part of the side walls as far as a vertical connection element in electrical conduction with said substrate.

31. The electromagnetic radiation detector as claimed in claim 8, wherein the substrate and the side walls are made of successive layers that are formed directly upon each other by deposition.

32. The electromagnetic radiation detector as claimed in claim 8, wherein it is devoid of any structure for anchoring support arms of sensitive membranes other than the side walls that define the micro-capsules.

33. The electromagnetic radiation detector as claimed in claim 8, wherein the upper wall has, in the vicinity of side walls, peripheral facets that slope towards substrate or a rounded profile capable of deflecting incident radiation in the vicinity of the boundaries between two micro-sites towards either of the adjacent micro-cavities.

34. The electromagnetic radiation detector as claimed in claim 8, wherein the micro-capsules of some of the micro-sites are filled with solid material.

35. The electromagnetic radiation detector as claimed in claim 31, wherein the substrate, the side walls and the upper wall are made of successive layers that are formed directly upon each other by deposition.

36. The electromagnetic radiation detector as claimed in claim 8, wherein the substrate is covered with a layer that acts as a reflector to reflect incident radiation towards sensitive membranes.

37. The electromagnetic radiation detector as claimed in claim 36, wherein the reflector consists wholly or partly of a material capable of collecting residual gas molecules trapped in the micro-cavities or getter.

38. The electromagnetic radiation detector as claimed in claim 8, wherein at least some of the micro-cavities are hermetically sealed.

39. The electromagnetic radiation detector as claimed in claim 38, wherein the hermetically sealed micro-cavities contain a low-thermal conductivity gas.

40. The electromagnetic radiation detector as claimed in claim 8, wherein the micro-detectors consist of microbolometers and the upper wall is at least partly made of a material selected from the group consisting of silicon, alloys of silicon and germanium, and zinc sulphide, as a single layer or a multilayer.

41. The electromagnetic radiation detector as claimed in claim 40, wherein the upper wall of a first portion of the micro-sites comprises at least one layer that is essentially transparent in the spectral band of interest which is different compared to the upper wall of at least a second portion of the micro-sites so that the wavelength $\lambda p1$ of the micro-detectors of the first portion is substantially different to the wavelength $\lambda p2$ of the at least second portion.

42. The electromagnetic radiation detector as claimed in claim 40, wherein the upper wall of some of the micro-sites comprises a layer that is substantially continuous and extends substantially over the entire surface area of said micro-sites and is opaque to all the radiation in the infrared spectrum.

43. The electromagnetic radiation detector as claimed in claim 42, wherein the opaque layer is made of metal.

44. The electromagnetic radiation detector as claimed in claim 40, wherein the upper wall of at least some of the micro-sites comprises a grid of electrically conducting patterns that substantially cover the entire surface area of said micro-sites.

45. The electromagnetic radiation detector as claimed in claim 44, wherein said grid is formed by parallel strips or lines arranged with a repetition pitch that is less than $\lambda min/3$.

46. The electromagnetic radiation detector as claimed in claim 45, wherein the upper wall of a first portion of the micro-sites comprises a grid formed in a first direction and the upper wall of a second portion of the micro-sites comprises a grid formed in a direction that is at right angles to the direction of the first grid.

47. The electromagnetic radiation detector as claimed in claim 44, wherein said grid is formed by repeating, in two directions in a plane parallel to the focal plane and with a repetition pitch of $\lambda p$ to $\lambda p/2$, an elementary pattern having dimensions that are equal to or less than the repetition pitch.

48. The electromagnetic radiation detector as claimed in claim 40, wherein at least some of the micro-sites comprise an upper wall whereof at least one layer consists of a material having a high-pass type transmission spectrum.

49. The electromagnetic radiation detector as claimed in claim 48, wherein the material is a semiconductor.

50. The electromagnetic radiation detector as claimed in claim 49, wherein the semiconductor is selected from the group consisting of $In_{(1-x)}Al_xAs$, $In_{(1-x)}Al_xSb$ in which $0 \le x \le 1$; $Hg_{(1-y)}Cd_yTe$ in which $0.2 \le y \le 0.6$; and PbS.

51. The electromagnetic radiation detector as claimed in claim 48, wherein a first portion of the micro-sites is provided with a high-pass filter having a first cut-off wavelength and at least a second portion of the micro-sites is provided with a high-pass filter having at least a second cut-off wavelength.

52. The electromagnetic radiation detector as claimed in claim 40, wherein at least some of the micro-sites comprise an upper wall whereof at least one layer consists of a material having variable transparency as a function of the incident electromagnetic flux.

53. The electromagnetic radiation detector as claimed in claim 52, wherein said material is selected from the group consisting of $In_{(1-x)}Al_xSb$, $In_{(1-x)}Al_xAs$ in which $0 \le x \le 1$; $Hg_{(1-y)}Cd_yTe$ in which $0.2 \le y \le 0.6$, and vanadium oxides having the generic formula VOx.

* * * * *